United States Patent [19]
Liao

[11] Patent Number: 6,100,142
[45] Date of Patent: Aug. 8, 2000

[54] METHOD OF FABRICATING SUB-QUARTER-MICRON SALICIDE POLYSILICON

[75] Inventor: Kuan-Yang Liao, Taipei, Taiwan

[73] Assignee: United Silicon Incorporated, Hsinchu, Taiwan

[21] Appl. No.: 09/280,761

[22] Filed: Mar. 29, 1999

[30] Foreign Application Priority Data

Mar. 1, 1999 [TW] Taiwan ................................. 88103041

[51] Int. Cl.⁷ ..................... H01L 21/336; H01L 21/3205
[52] U.S. Cl. ......................... 438/291; 438/305; 438/585; 438/592
[58] Field of Search ..................... 438/291, 305, 438/585, 592

[56] References Cited

U.S. PATENT DOCUMENTS 5,082,794 1/1992 Pfiester et al. .
5,374,575 12/1994 Kim et al. .
5,576,574 11/1996 Hong .
5,612,240 3/1997 Chang .
5,677,218 10/1997 Tseng .

Primary Examiner—Richard Booth
Assistant Examiner—Ron Pompey
Attorney, Agent, or Firm—Jiawei Huang; J.C. Patents

[57] ABSTRACT

A method of fabricating a semiconductor device using a Salicide process to increase the surface area of a polysilicon gate is described. First, a polysilicon layer is formed over a substrate. A mask layer with an opening is formed on the polysilicon layer. A mask spacer is formed on the sidewalls of the opening. Part of the polysilicon layer under the opening is removed with the mask spacer and the mask layer serving as a mask. An insulating layer is formed in the opening. The mask spacer and the mask layer are removed. The polysilicon layer that is not covered by the insulating layer is removed. The insulating layer is removed to expose the surface of the remaining polysilicon layer, wherein a groove is formed on the surface of the remaining polysilicon layer. Then a Salicide process is performed to form a metal silicide layer on the substrate and the remaining polysilicon layer.

21 Claims, 5 Drawing Sheets

METHOD OF FABRICATING SUB-QUARTER-MICRON SALICIDE POLYSILICON

CROSS-REFERENCE TO RELATED APPLICATION

This application claims the priority benefit of Taiwan application serial no. 88103041, filed Mar. 1, 1999, the full disclosure of which is incorporated herein by reference.

BACKGROUND OF THE INVENTION

1. Field of Invention

The present invention generally relates to a method of fabricating a semiconductor device using a self-aligned silicide (Salicide) process, and more particularly to a method of fabricating a sub-quarter-micron Salicide polysilicon.

2. Description of Related Art

In accordance with advances in semiconductor process techniques, Salicide process is commonly used to form a metal silicide layer having good qualities, such as a high melting point, a high reliability and a low resistance. As IC devices are scaled down, line width of semiconductor device gates, contact areas between conductive layers, and junction depths are accordingly shrinking. The metal silicide layer is therefore formed on a polysilicon gate or a source/drain region to increase the performance of IC devices, to decrease junction resistance and to decrease RC delay which is generated from resistors and capacitors in IC devices. Therefore, driving current, response time and operation speed of IC devices increase due to the formation of the metal silicide layer.

FIGS. 1A and 1B are schematic, sequential cross-sectional diagrams showing a conventional Salicide process. As shown in FIG. 1A, a substrate 100 is provided. A MOS transistor composed of a gate 102, a spacer 104 and source/drain regions 106 is formed on the substrate 100. A metal film 108 is formed on the gate 102, the spacer 104 and source/drain regions 106. As shown in FIG. 1B, an annealing process (or a thermal process) is performed on the metal film 108 to make the metal react with the silicon that is under the metal film 108 to form a metal silicide layer 110 and 112. The metal silicide layer 110 is formed on the top surface of the gate 102 and the metal silicide layer 112 is formed on the source/drain regions 106. There is no metal silicide layer formed on other region that does not include silicon. Then the remaining metal is removed by selective wet etching. The metal silicide layer 110 and 112 are therefore exposed, as shown in FIG. 1B. As described, there is no photolithography process performing during the Salicide process.

As IC devices are scaled down even more, particularly in the deep sub-micron semiconductor techniques, sizes of semiconductor devices, contact areas between conductive layers, and junction depths are increasingly shrinking. The spacer film stress problem and the narrow line-width effect that results in limiting formation of metal silicide layer on corners 114 of the gate 102, as shown in FIG. 1B. As the area of the metal silicide layer 110 on the gate 102 decreases, the nucleation area of the metal silicide layer decreases to make it difficult to decrease of sheet resistance. The efficiency of increasing driving current, response time and operation speed of IC devices therefore is reduced.

SUMMARY OF THE INVENTION

Accordingly, the object of the present invention is to provide a method of fabricating a sub-quarter-micron Salicide polysilicon to decrease the gate sheet resistance and to increase operation speed of IC devices.

To achieve these and other advantages and in accordance with the purpose of the invention, as embodied and broadly described herein, the invention provides a method of fabricating a semiconductor device using a Salicide process. First, a polysilicon layer is formed over a substrate. A mask layer with an opening is formed on the polysilicon layer. A mask spacer is formed on sidewalls of the opening. Part of the polysilicon layer under the opening is removed by etching. A thermal oxidation is performed on the exposed polysilicon layer to form a thin oxide layer. An insulating layer is formed in the opening. The mask spacer and the mask layer are removed. The polysilicon layer that is not covered by the insulating layer is removed. The insulating layer and the thin oxide layer are removed to expose the surface of the remaining polysilicon layer, wherein a groove is formed on the surface of the remaining polysilicon layer. Then a Salicide process is performed to form a metal silicide layer on the substrate and the remaining polysilicon layer.

The method of forming the opening includes a photolithography process and anisotropic etching. The above-mentioned mask spacer is used to decrease the difficulty of the photolithography process for fabricating a gate structure with a small line width. The method of removing part of the polysilicon layer under the opening is preferably anisotropic dry etching with the mask spacer and the mask layer serving as a mask. Thermal oxidation is performed to form a groove structure on the surface of the polysilicon layer. As the reacting gas source diffuses in a horizontal direction during thermal oxidation, the oxide layer is also formed on the interface between the polysilicon layer and the mask spacer. In addition, a wet etching can be used instead of the thermal oxidation to form the groove structure. The groove structure can increase the surface area of the polysilicon layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A through 2I are schematic, sequential cross-sectional diagrams showing a method of fabricating a semiconductor device using a Salicide process. This embodiment is applied to 0.18 microns semiconductor process technique, for example, or other semiconductor processes technique under 0.18 microns. In addition, this embodiment can be adjusted or changed to fulfill the requirements of practical semiconductor process.

Figure 1A:
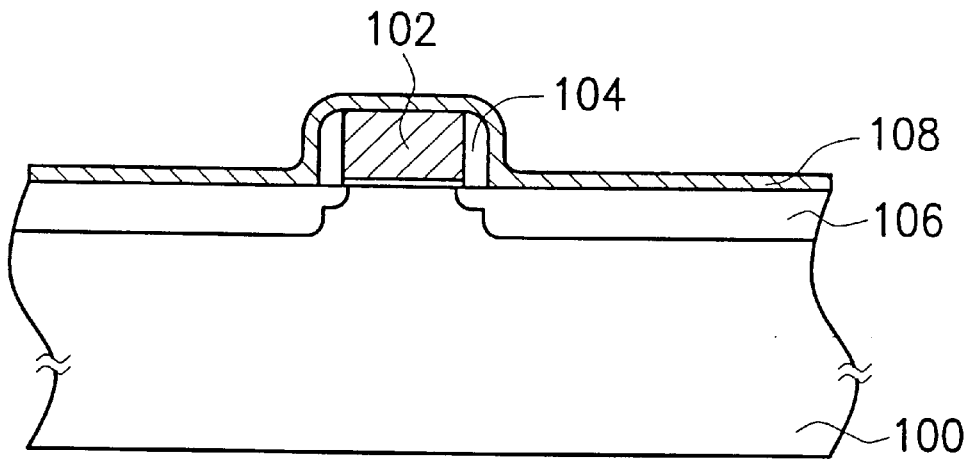
FIGS. 1A and 1B are schematic, sequential cross-sectional diagrams showing a conventional Salicide process.
Figure 1B:
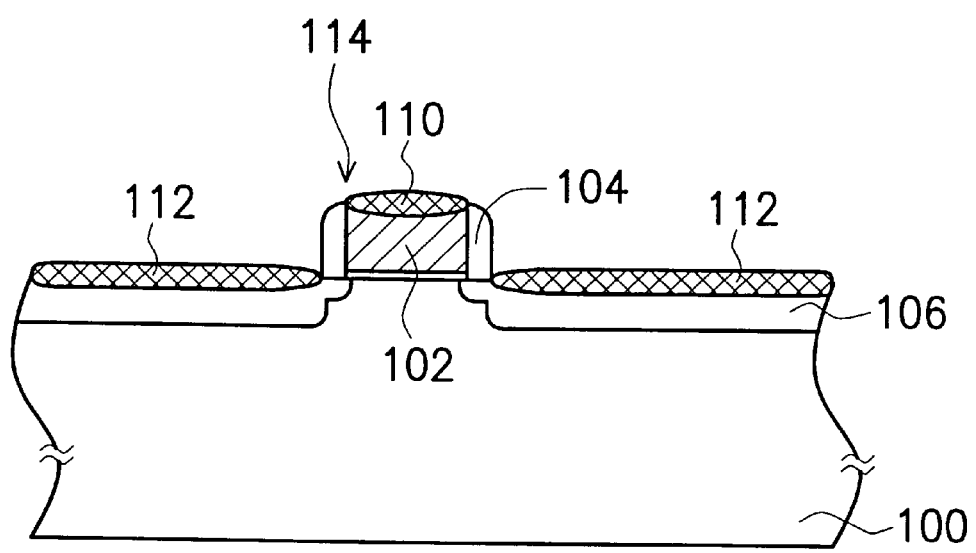
Figure 2A:
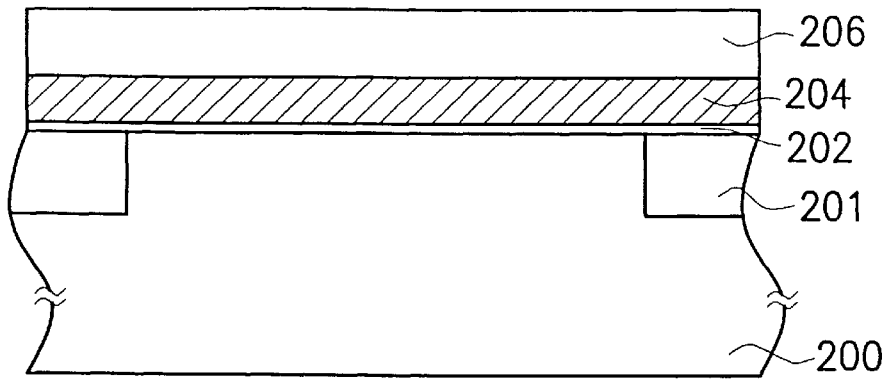
FIGS. 2A through 2I are schematic, sequential cross-sectional diagrams showing a method of fabricating a semiconductor device using a Salicide process.

As shown in FIG. 2A, a substrate 200 such as silicon substrate is provided. An insulating region 201 such as shallow trench isolation (STI) is formed in the substrate 200. An oxide layer 202 is formed over the substrate 200. The oxide layer 202 is preferably formed by thermal oxidation or chemical vapor deposition (CVD). The thickness of the oxide layer 202 is preferably about 30–50 angstroms. Then a conductive layer 204 and a mask layer 206 are sequentially formed on the oxide layer 202. The conductive layer 204 is formed by CVD and its material is preferably polysilicon. The thickness of the conductive layer 204 is preferably about 2000 angstroms. The mask layer 206 is formed by CVD and its material is preferably silicon nitride. The thickness of the mask layer 206 is preferably about 500 angstroms. The mask layer 206 and the conductive layer 204 have different etching and polishing rates.

Figure 2B:
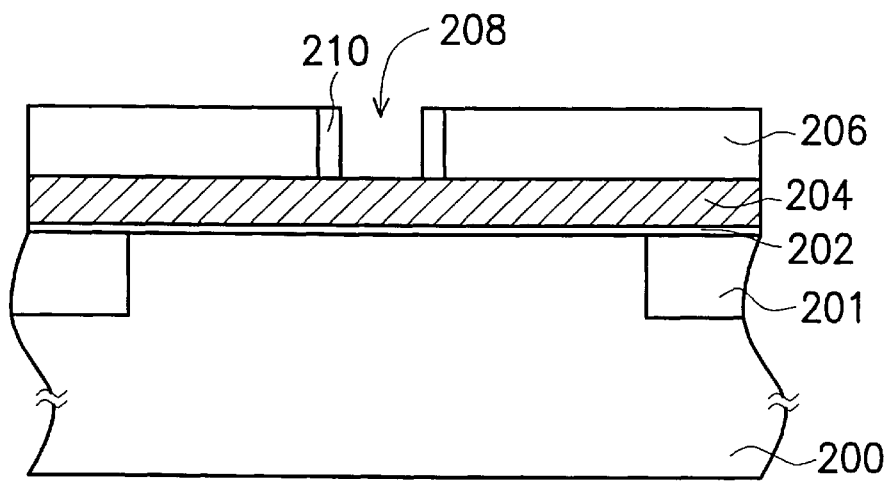

As shown in FIG. 2B, an opening 208 is formed in the mask layer 206. The method of forming the opening 208 includes first performing a photolithography process and then anisotropically etching the mask layer 206 to expose part of the conductive layer 204 and to form sidewalls of the mask layer 206 in the opening 208. Then a mask spacer 210 is formed on the sidewalls of the mask layer 206. The mask spacer 210 is used to decrease the difficulty of photolithography process for subsequently fabricating a gate structure with a small line width. That is, a conventional photolithography process that is used to fabricate the gate with a larger line width can be used to fabricate the gate with small line width. For example, a conventional photolithography process that is used to fabricate the gate with a 0.25 line width can be used to fabricate the gate with a 0.18 line width. The mask spacer 210 and the conductive layer 204 have different etching rates and polishing rates. The method of forming the mask spacer 210 includes first depositing a silicon nitride layer and then anisotropically etching the silicon nitride layer to expose the bottom of the opening 208, thus forming the mask spacer 210 on the sidewalls of the mask layer 206 in the opening 208.

Figure 2C:
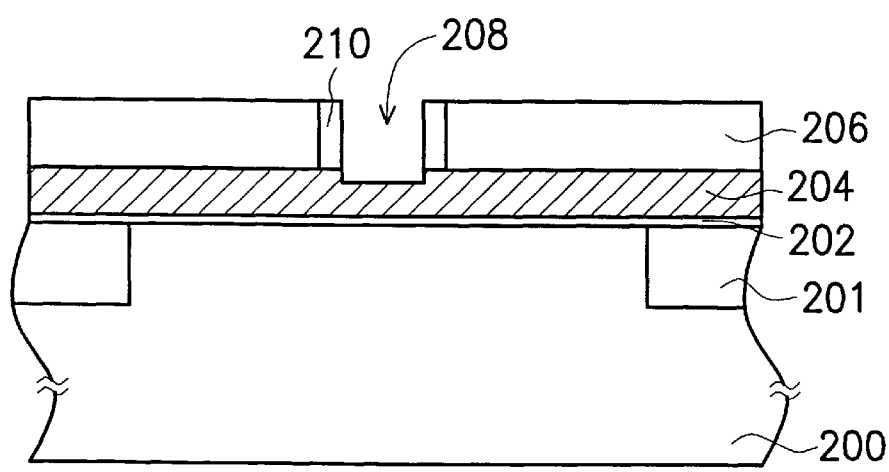

As shown in FIG. 2C, part of the conductive layer 204 under the opening 208 is removed. The method of removing part of the conductive layer 204 is preferably etching with the mask spacer 210 and the mask layer 206 serving as a mask to expand the opening 208 to the conductive layer 204. The cross-sectional view of the opening 208 is elongated from the sidewalls of the mask spacer 210. The etching process includes anisotropic dry etching. The etching depth (or removing depth) is preferably about 20–30 percent of the whole thickness of the conductive layer 204.

Figure 2D:
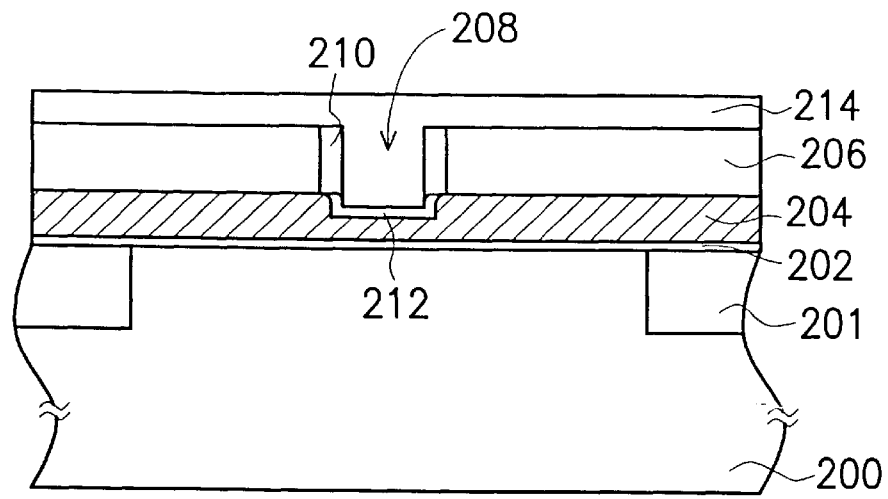

As shown in FIG. 2D, a thin oxide layer 212 is formed on the exposed surface of the opening 208 (bottom of the opening 208) by thermal oxidation. As the reacting gas source diffuses in a horizontal direction during thermal oxidation, the thin oxide layer 212 is also formed on the interface between the conductive layer 204 and the mask spacer 210. The temperature range of the thermal oxidation is preferably about 800–1000° C.

An insulating layer 214 is formed over the substrate 200, and the thin oxide layer 212, and fills the opening 208. The object of the insulating layer 204 is to be subsequently used as an etching mask. The insulating layer 214 is not required to fill the opening 208 and can be adjusted or changed to fulfill the requirements of practical semiconductor process. The insulating layer 214 and the mask spacer 210 have different etching rates and polishing rates. The insulating layer 214 and the mask layer 206 have different etching rates. The material of the insulating layer 214 is preferably silicon oxide that is formed by CVD.

Figure 2E:
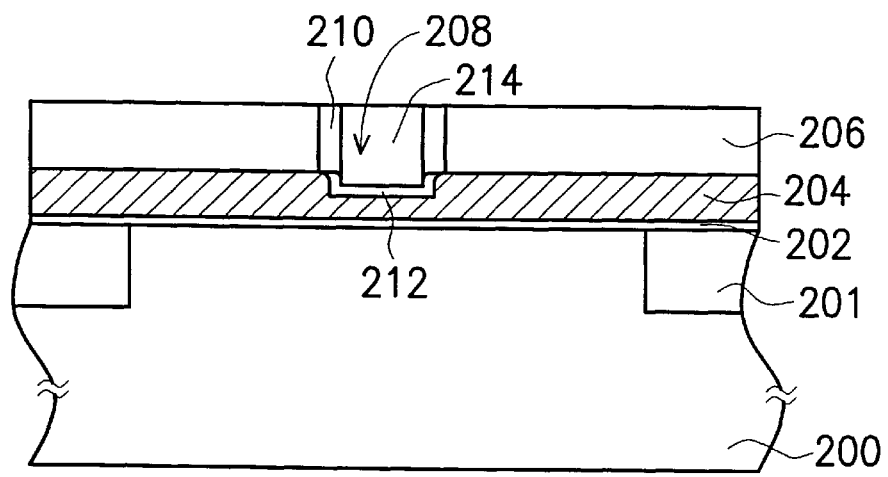

As shown in FIG. 2E, a planarization process is performed to remove part of the insulating layer 214 over the mask layer 206 to expose the surface of the mask layer 206. Part of the insulating layer 204 in the opening 208 thus remains. The method of removing the insulating layer 214 over the mask layer 206 is preferably etching back or polishing. The etching back process is performed using the different etching rates of insulating layer 214, the mask layer 206 and the mask spacer 210. The polishing process is chemical mechanical polishing (CMP).

Figure 2F:
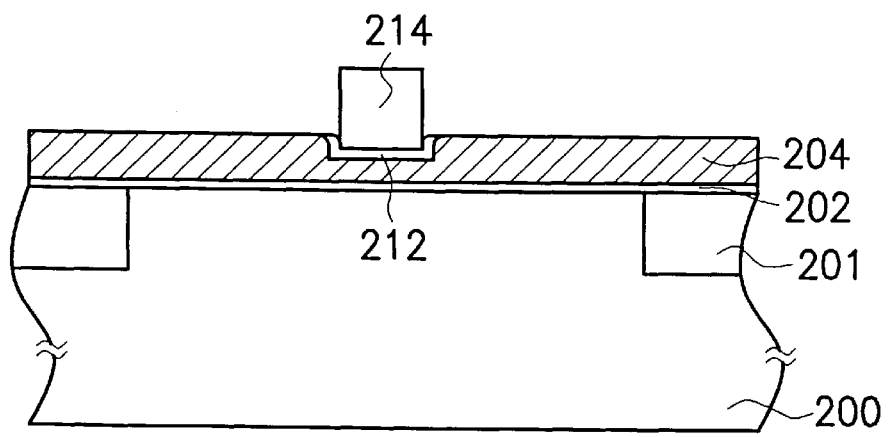

As shown in FIG. 2F, the mask spacer 210 and the mask layer 206 are removed to expose the surface of the conductive layer 204. The method of removing the mask spacer 210 and the mask layer 206 is preferably selective wet etching using a hot phosphoric acid treatment.

Figure 2G:
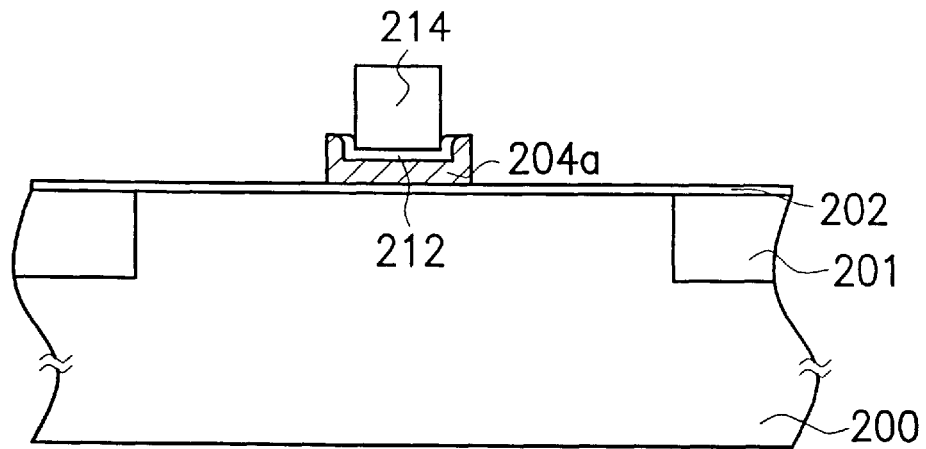

As shown in FIG. 2G, part of the conductive layer 204 that is not covered by the insulating layer 214 and the thin oxide layer 212 is removed to expose the surface of the oxide layer 202. The method of removing part of the conductive layer 204 is preferably anisotropic dry etching with the insulating layer 214 and the thin oxide layer 212 serving as a mask. The remaining conductive layer 204a acts as a gate.

Figure 2H:
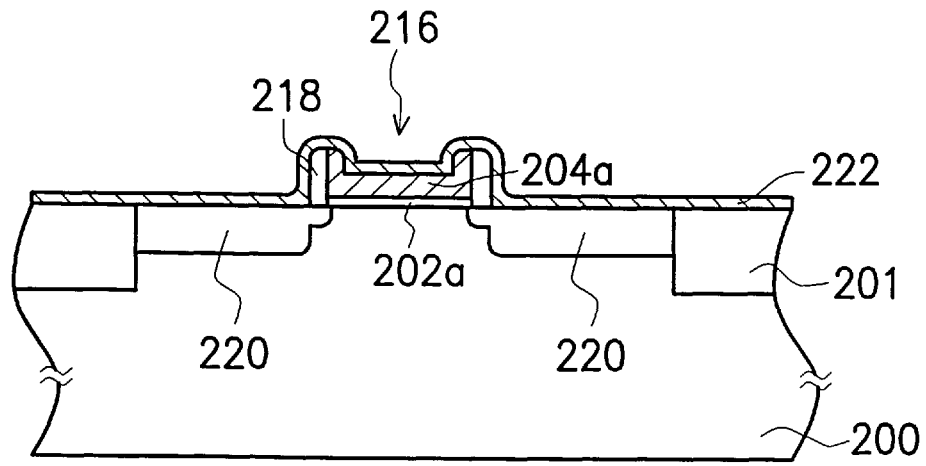

As shown in FIG. 2H, the insulating layer 214 and the thin oxide layer 212 are removed to expose the surface of the remaining conductive layer 204a. A groove 216 is accordingly formed on the surface of the remaining conductive layer 204a. The method of removing the insulating layer 214 and the thin oxide layer 212 is preferably wet etching using HF solution or buffer oxidation etchant (BOE) treatment. During wet etching, part of the oxide layer 202 is sequentially removed to expose the substrate 200. The remaining oxide layer 202a acts as a gate oxide layer. A spacer 218 is formed on sidewalls of the remaining conductive layer 204a. The method of forming the spacer 218 includes first depositing a conformal silicon nitride layer on the substrate 200 by CVD and then anisotropically etching back the silicon nitride layer to form the spacer 218. Source/drain regions 220 are formed in the substrate 200 by ion implanting to implant dopant into the substrate 200. The dopant is preferably N-type ions such as arsenic and phosphorus or P-type ions such as boron.

A Salicide process is then performed on the substrate 200. A metal layer 222 is formed on the remaining conductive layer 204a. The material of the metal layer 222 is preferably refractory metal such as titanium (Ti), tungsten (W), cobalt (Co), nickel (Ni), platinum (Pt) or palladium. The method of forming the metal layer 222 is preferably CVD, physical vapor deposition (PVD) or sputtering.

Figure 2I:
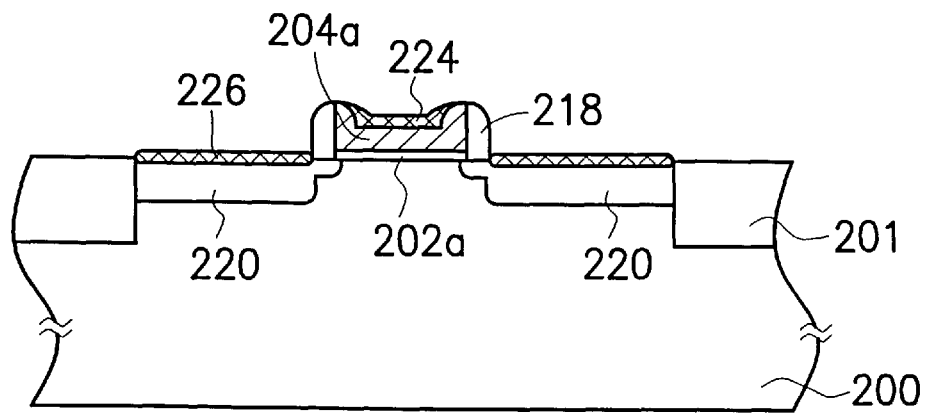

As shown in FIG. 2I, an annealing process is performed on the metal layer 222 to make the metal react with the silicon that is under the metal layer 222 to form a metal silicide layer 224 and 226. The metal silicide layer 224 is formed on the conductive layer 204a and the metal silicide layer 226 is formed on the source/drain regions 220. Then the remaining metal layer 222 that does not react with silicon is removed. The method of removing the remaining metal layer 222 is preferably selective wet etching. For example, if the material of the metal layer 222 is titanium, the temperature of the annealing process is about 800° C. and the selective wet etching is performed using a solution such as $H_2O_2$ and $NH_4OH$ solution as an etchant.

Figure 3A:
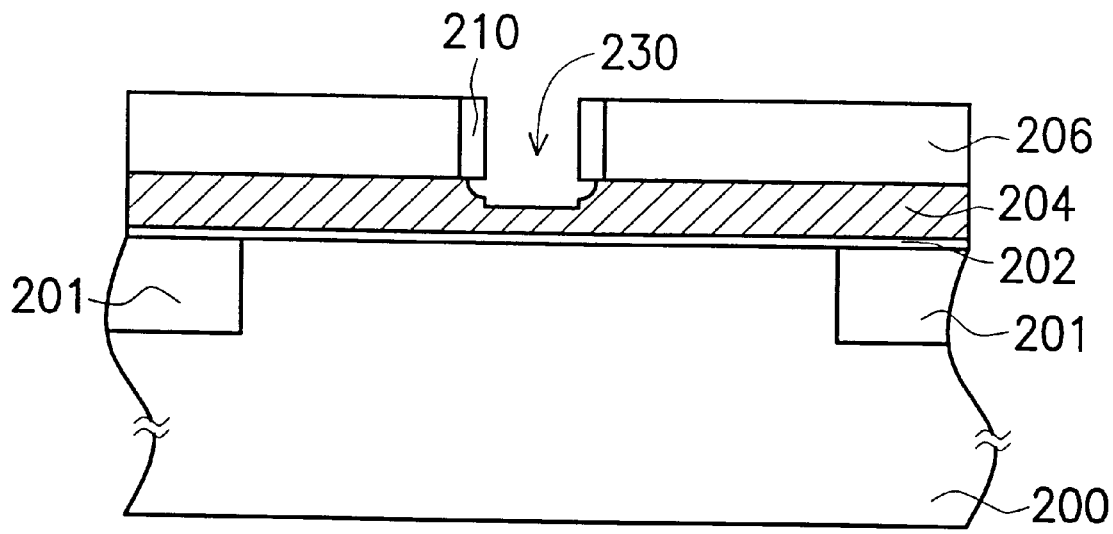
FIGS. 3A and 3B are schematic, sequential cross-sectional diagrams showing another method of fabricating a semiconductor device using a Salicide process.
Figure 3B:
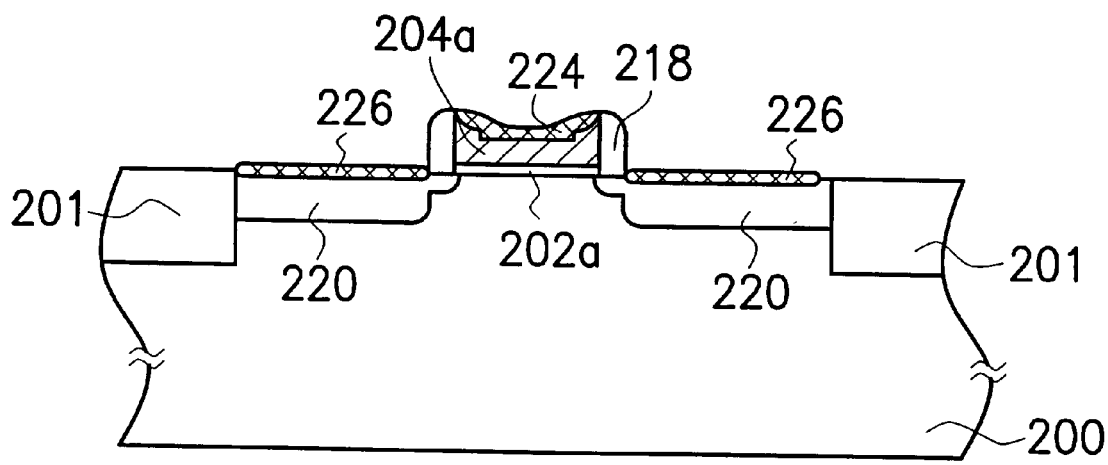

FIGS. 3A and 3B are schematic, sequential cross-sectional diagrams showing another method of fabricating a semiconductor device using a Salicide process. As described above in FIG. 2D, the thin oxide layer 212 is formed by thermal oxidation to generate the groove 216 on the surface of the conductive layer 204a. The method of forming the groove 216 is not limited to thermal oxidation; other process can be used instead of the thermal oxidation. For example, an isotropic etching can be used instead of the thermal oxidation to form the groove 216. Therefore, following FIG. 2C, part of the bottom of the opening 208 is removed to form a groove 230 (or cross-section bowl structure 230), as shown in FIG. 3A. Then, following from FIGS. 2D to 2I, an insulating layer 214 is formed and the remaining metal layer 222 is removed, and so on. The metal silicide layers 224 and 226 are accordingly formed, as shown in FIG. 3B.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a semiconductor device using a self-aligned silicide (Salicide) process, comprising:
    forming an oxide layer on a substrate;
    forming a conductive layer on the oxide layer;
    forming a mask layer on the conductive layer and forming an opening in the mask layer, wherein sidewalls of the mask layer in the opening are exposed;
    forming a mask spacer on the sidewalls of the mask layer;
    removing a part of the conductive layer under the opening with the mask spacer and the mask layer serving as a mask;
    forming an insulating layer in the opening;
    removing the mask spacer and the mask layer;
    removing the conductive layer which is not covered by the insulating layer;
    removing the insulating layer to expose a surface of the conductive layer;
    forming a spacer on the sidewalls of the conductive layer; and
    performing a Salicide process to form a metal silicide layer on the substrate and the conductive layer.

2. The method of fabricating a semiconductor device using the Salicide process of claim 1, wherein the insulating layer, the mask layer and the mask spacer have different etching rates and polishing rates.

3. The method of fabricating a semiconductor device using the Salicide process of claim 2, wherein the insulating layer includes a silicon oxide layer formed by chemical vapor deposition (CVD).

4. The method of fabricating a semiconductor device using the Salicide process of claim 2, wherein the mask layer and the mask spacer include silicon nitride formed by CVD.

5. The method of fabricating a semiconductor device using the Salicide process of claim 1, wherein the method of forming the insulating layer in the opening comprises:
    forming a cover insulating layer on the mask layer and in the opening; and
    performing a planarization process to remove part of the cover insulating layer over the mask layer to expose the mask layer.

6. The method of fabricating a semiconductor device using the Salicide process of claim 1, wherein the conductive layer includes polysilicon.

7. The method of fabricating a semiconductor device using the Salicide process of claim 1, wherein the method of removing the conductive layer which is not covered by the insulating layer includes anisotropic etching with the insulating layer serving as a mask.

8. The method of fabricating a semiconductor device using the Salicide process of claim 1, wherein the method of forming the metal silicide layer on the substrate and the conductive layer comprises:
    forming a metal layer on the substrate and the conductive layer;
    performing a thermal process to make the metal layer react with silicon to form the metal silicide layer; and
    removing the remaining metal layer.

9. The method of fabricating a semiconductor device using the Salicide process of claim 8, wherein the metal layer includes a refractory metal.

10. The method of fabricating a semiconductor device using the Salicide process of claim 1, wherein after forming the spacer on sidewalls of the conductive layer further comprises forming a source/drain region in the substrate, and the metal silicide layer is also formed on the source/drain region.

11. A method of fabricating a semiconductor device using a Salicide process, comprising:
    forming a first oxide layer on a substrate;
    forming a conductive layer on the first oxide layer;
    forming a mask layer on the conductive layer and forming an opening in the mask layer, wherein sidewalls of the mask layer in the opening are exposed;
    forming a mask spacer on the sidewalls of the mask layer;
    removing part of the conductive layer under the opening with the mask spacer and the mask layer serving as a mask;
    performing a thermal oxidation process to form a second oxide layer on the exposed conductive layer;
    forming an insulating layer on the second oxide layer in the opening;
    removing the mask spacer and the mask layer;
    removing the conductive layer which is not covered by the insulating layer;
    removing the insulating layer and the second oxide layer to expose a surface of the conductive layer, wherein the surface of conductive layer has a groove;
    forming a spacer on sidewalls of the conductive layer; and
    performing a Salicide process on the substrate and the conductive layer.

12. The method of fabricating a semiconductor device using the Salicide process of claim 11, wherein the insulating layer, the mask layer and the mask spacer have different etching and polishing rates.

13. The method of fabricating a semiconductor device using the Salicide process of claim 12, wherein the insulating layer includes silicon oxide layer formed by CVD.

14. The method of fabricating a semiconductor device using the Salicide process of claim 12, wherein the mask layer and the mask spacer include silicon nitride formed by CVD.

15. The method of fabricating a semiconductor device using the Salicide process of claim 11, wherein the method of forming the insulating layer in the opening comprises:
    forming a cover insulating layer on the mask layer and in the opening; and
    performing a planarization process to remove part of the cover insulating layer over the mask layer to expose the mask layer.

16. The method of fabricating a semiconductor device using the Salicide process of claim 11, wherein the conductive layer includes polysilicon.

17. The method of fabricating a semiconductor device using the Salicide process of claim 11, wherein the method of removing the conductive layer which is not covered by the insulating layer includes anisotropic etching with the insulating layer serving as a mask.

18. The method of fabricating a semiconductor device using the Salicide process of claim 11, wherein the method of forming the metal silicide layer on the substrate and the conductive layer comprises:

forming a metal layer on the substrate and the conductive layer;

performing a thermal process to make the metal layer reacting with silicon to form the metal silicide layer; and removing the remaining metal layer.

19. The method of fabricating a semiconductor device using the Salicide process of claim 18, wherein the metal layer includes a refractory metal.

20. The method of fabricating a semiconductor device using the Salicide process of claim 11, wherein after forming the spacer on the sidewalls of the conductive layer further comprises forming a source/drain region in the substrate, and the metal silicide layer is also formed on the source/drain region.

21. The method of fabricating a semiconductor device using the Salicide process of claim 11, wherein the material of the conductive layer includes a polysilicon layer.

* * * * *